United States Patent [19]

Olson et al.

[11] Patent Number: 4,868,986
[45] Date of Patent: Sep. 26, 1989

[54] CHIP CRACKER DEVICE

[76] Inventors: Steven N. Olson, 1005 E. Bridge St., Streator, Ill. 61364; Rodney J. Olson, 432 E. Johnson, River Falls, Wis. 54022; Eugene H. Olson, Rte. 1, Box 269, Prescott, Wis. 54021

[21] Appl. No.: 166,646

[22] Filed: Mar. 11, 1988

[51] Int. Cl.[4] .............................................. B26B 17/00
[52] U.S. Cl. ......................................... 30/193; 29/261; 29/426.4; 29/764; 29/829; 30/188; 81/395; 81/399
[58] Field of Search .............. 29/261, 262, 256, 426.4, 29/758, 764, 829; 81/395, 399, 334; 225/103, 93; 30/187, 188, 193, 120.2, 120.5, 349

[56] References Cited

U.S. PATENT DOCUMENTS

| 298,587 | 5/1884 | Jencks | 30/349 |
|---|---|---|---|
| 377,759 | 2/1888 | Johnson | 30/349 |
| 1,278,849 | 9/1918 | Butterworth | 30/349 X |
| 2,607,250 | 8/1952 | Zeissl | 81/49 |
| 2,956,340 | 10/1960 | Levenson | 30/187 X |
| 3,050,841 | 8/1962 | Esselstyn | 29/268 |
| 3,602,971 | 9/1971 | Halstead | 29/203 H |
| 3,757,406 | 9/1973 | Bezar | 29/203 H |
| 3,797,092 | 3/1974 | Einarson | 29/203 H |
| 3,825,990 | 7/1974 | Shields | 29/268 |
| 4,554,848 | 11/1985 | Galletto | 81/447 |
| 4,571,824 | 2/1986 | Ingaglio | 29/764 |

FOREIGN PATENT DOCUMENTS

| 20244 | of 1901 | United Kingdom | 30/188 |
|---|---|---|---|
| 23261 | of 1901 | United Kingdom | 30/187 |

Primary Examiner—Carl E. Hall
Attorney, Agent, or Firm—Anthony G. Eggink

[57] ABSTRACT

The chip cracking device is for engaging the lateral surfaces of a mounted computer chip. The device body has a pair of curved leg members having upper and lower portions with inwardly extending centrally disposed structures. A pivot member is operative on the inwardly disposed structures and an adjustable and hand operable knob is operative on the upper portions of the leg members. The chip cracking device further has opposing jaw members with lateral cutting edges of a predetermined slope so that the adjustable movement of the knob causes the cutting edges to crack and separate the chip body for subsequent removal from its mounting structure.

15 Claims, 1 Drawing Sheet

CHIP CRACKER DEVICE

BACKGROUND OF THE INVENTION

This invention deals with devices for aiding in the process of removing computer chips from their mounting structures. Particularly, this invention deals with devices for cracking the body of defective computer chips to expose the pins thereof and to facilitate the removal of the chips from circuit boards.

In the repair of circuit board assemblies or similar chip mounting structures in environments where computer chips are utilized, it has been difficult to remove chip bodies for replacement purposes. Particularly, it has been difficult to remove chip bodies in an efficient and effective manner without damaging the circuit board assemblies or similar structures themselves.

This invention provides chip cracking devices that are constructed and arranged to split and crack the computer chip bodies for exposing their connecting pins. The exposure of the computer chip pins provides for the subsequent easy removal of the remaining chip parts and thus permits the replacement of the computer chip in repairing circuit boards or similar computer chip mounting structures.

In the past, computer chip boards were more limited in use and often utilized either in a disposable manner or wherein the boards were repairable only in specific repair environments. Consequently, prior art devices have primarily been proposed or utilized for manipulating entire circuit boards or manipulating an entire computer chip. As a result, various types of ineffective and improper tools and methods are presently being utilized to remove computer chip bodies from circuit boards and which often result in inefficient removal and damage to the board structures itself.

The chip cracking device of this invention provides for the efficient and effective removal of chip bodies for repairing circuit boards. The devices according to the teachings of this invention provide hand operable structures that permit the adjustable application of cutting forces at predetermined locations of the chip body to cause the cracking and splitting thereof to expose the terminal pins for further engagement and removal in preparation of a replacement chip.

Although a need exists in the circuit board repair service industry for a device to quickly and effectively aid in the removal of a range of chip body sizes and configurations, none in so far as is known has been developed.

SUMMARY OF THE INVENTION

The invention provides a computer chip cracking device for engaging the lateral surfaces of a mounted computer chip having a plurality of pins extending therefrom. The chip cracking device comprises a pair of generally curved leg members having upper and lower portions and each having an inwardly extending centrally disposed structure. A pivot member is operative on the centrally disposed structures of the leg members and an adjustable, hand operable force means is provided to be operative on the upper portion of the leg members.

The chip cracker has opposing jaw members with lateral cutting edges of a predetermined slope at the lower portion of the leg members, whereby the adjustable movement of the force means with respect to the upper portion of the leg members causes the cutting edges to engage the lateral surfaces of the computer chip to crack and separate the chip. The pins of the chip are thus exposed for easy removal of the remaining chip parts from the mounting structure.

The computer chip cracking device of this invention further provides beveled cutting edges having a predetermined angle range measurement, as well as further jaw member and cutting edge configurations for engaging chip bodies. The adjustable force means of the device includes a threaded shaft having a knob portion on one end for the adjustable movement through a threaded aperture in one leg member and for abutment against the opposite leg member.

Additionally, the adjustable force means includes a threaded shaft member having a knob structure generally centrally located and which has oppositely threaded shafts disposed outwardly therefrom for movement through aligned threaded members disposed in apertures in the top portions of the leg members.

The bottom portions of the leg members are further constructed and arranged to receive adapter structures which are provided for extending the cutting edge lengths of the cutting jaws. Additionally, chip cracker body structure compositions are provided for manufacturing the chip cracking devices of this invention.

These and other benefits of this invention will become clear from the following description by reference to the drawings.

DESCRIPTION OF THE PREFERRED EMBODIMENTS

Figure 1:
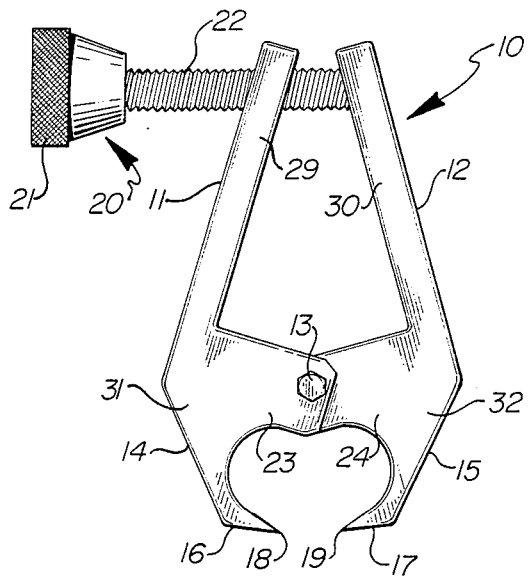
FIG. 1 is a frontal plan view of the chip cracker device of this invention.

Referring to FIG. 1, a chip cracker device 10 is shown having opposing and cooperating leg members 11 and 12 that are rotatably joined by a pivot member 13. The chip cracker structure 10 is shown in an opened configuration whereby the cutting edges 18 and 19 at the bottom of the body structure are spread apart.

Figure 3:
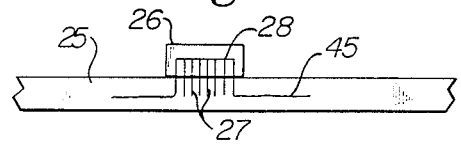
FIG. 3 is a lateral plan view of a circuit board having a computer chip mounted thereon.

The chip cracker device 10 is constructed and arranged to repair circuit boards 25, for example, as shown in FIG. 3. A typical circuit board structure is shown as comprising a circuit board 25 with a computer chip 26 mounted thereon. The computer chip 26 has leads 28 and pin members 27 that extend from the chip body and communicate with the circuitry 45 of the circuit board 25.

As is known, computer chips 26 are typically constructed of hard silicon materials having pins 27 laterally extending from the chip body and that are integrally mounted and connected to a circuit board structure 25. Computer chips 26 of this nature are utilized in many devices and apparatus including medical devices, consumer products and commercial machinery. Chip 26 arrangements of this type are often and increasingly utilized in the electronic control circuitry of these machines, devices and products.

In the repair of faculty circuit boards 25, a certain computer chip 26 is often found to be inoperative or defective and, therefore, the removal of the chip 26 is required for subsequent replacement to repair the circuit board. Because of the permanent mounting of the chip body to the circuit board 25 and the hard silicon construction of the chip body itself, the removal of the inoperative chip is difficult and often results in permanent damage to the circuit board 25 itself. The device 10 of this invention is for cracking and crushing the chip body so as to expose the pins 27 and lead connections 28 so that the pins 27 can subsequently be carefully and individually removed from the circuit board 25. In order to effectuate the further removal of the partially destroyed chip body 26 to expose the pins 27 and leads 28, the remaining chip body structure can be heated to further aid in the process of cleaning the chip mount structure in preparing the site for a new chip.

Figure 2:
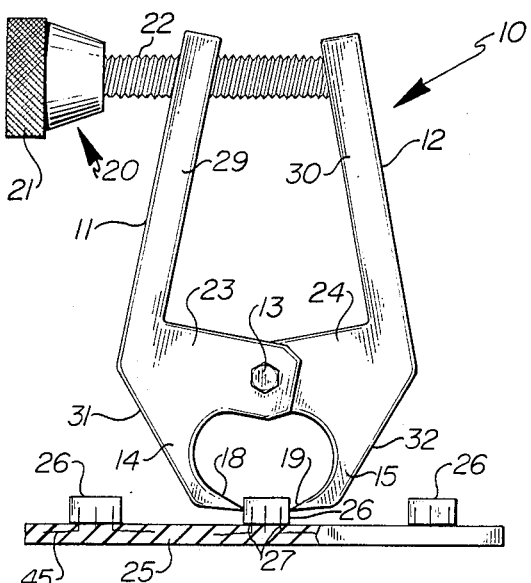
FIG. 2 is a frontal plan view of the chip cracker device of this invention in an operative position with respect to a computer chip mounted on a circuit board.

The chip cracker device 10 is shown in its operative position in FIG. 2 for the removal of a chip body located in a row of chips 26 mounted on circuit board 25. The leg members 11 and 12 are joined in a scissored configuration and define upper leg portions 29 and 30 and lower leg portions 31 and 32. The leg members 11 and 12 are generally of a C-shaped configuration having centrally located and inwardly extending opposing pivot structures 23 and 24 wherein the pivot member 13 is located for operation. As further shown in FIG. 4, the pivot member 13 has a threaded shaft 43 and nut 44 to permit the forces exerted by the thumb screw 20 or force means 35 to be directly transferred to the cutting edges 18 and 19. And, the centrally disposed pivot structures 23 and 24, through which the pivot member 13 operates, provide the necessary moments of force to be transferred to the opposing cutting edges 18 and 19.

Thus, the device structure forms a pivotal mechanism which rotates about the axis of the pivot member 13. The chip cracker device 10, therefore, has a predetermined range of movement due to the configuration of the C-shaped leg members 11, 12 and the centrally disposed pivot structures 23 and 24 which extend inward generally from the apex positions of their respective C-shaped leg member body structures. The upper leg member portions 29 and 30 of the leg members 11 and 12 are constructed and arranged to cooperate with an internally and adjustably active force means which adjustably forces the upper leg members apart. As shown in FIGS. 1 and 2, a hand operable thumb screw 20 is provided for threaded extension through upper leg portion 29 and for abutment against the interior surface of the upper leg portion 30. The thumb screw assembly 20 has a threaded shaft 22 which threadingly engages the cooperating thread structure through an aperture in the upper leg 29. The end of the threaded shaft 22 has a rounded and smooth configuration to slidingly engage the interior surface of the upper portion of leg member 12. The particular thread spacings of the shaft 22 and the upper leg aperture provides means to control the amount of force required to spread the opposing leg members 11 and 12. A knurled knob structure 21 is mounted or integrally formed on one end of the shaft 22. The knurled exterior configuration of the knob 21 provides a positive gripping surface for the fingers and thumb of the user.

Figure 4:
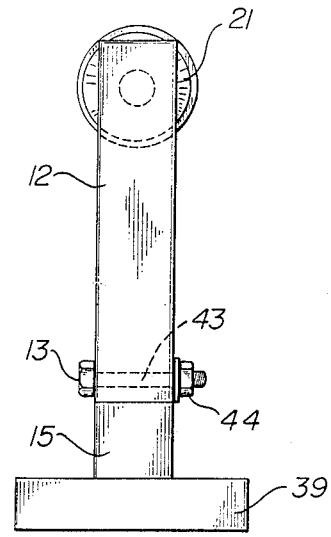
FIG. 4 is lateral view showing an alternative embodiment of the chip cracker device.
Figure 5:
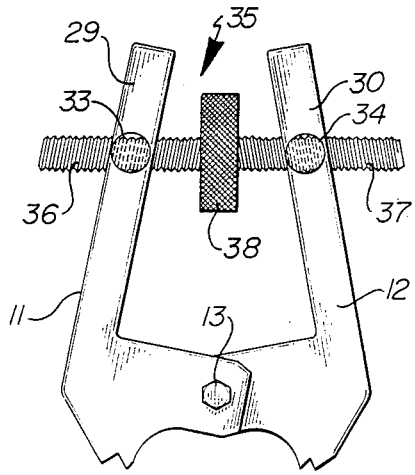
FIG. 5 is a frontal partial plan view of an alternative upper portion embodiment of the chip cracker device of the invention.

FIGS. 4 and 5 show an alternate embodiment 35 of the adjustable force means operative on upper leg portions 29 and 30 of the chip cracker device. The adjustable force means 35 shown is comprised of two oppositely threaded shaft portions 36 and 37 and having a centrally disposed knob 38 fixed therebetween. The threaded shaft members 36 and 37 extend through the upper leg portions 29 and 30 which respectively have rotatable and threaded members 33 and 34. The threaded members 33 and 34 are mounted for rotation in the upper leg portions 29 and 30, respectively, so that the leg members 11 and 12 of the chip cracker device can be spread apart or brought together as the knurled knob 38 is rotated. The rotatable and threaded members 33 and 34 can be pin structures having threaded apertures to receive the threaded shafts 36 and 37. The threaded apertures of the members 33 and 34 are in alignment with the apertures in the upper leg portions 29 and 30. The apertures in the upper leg portions 29 and 30 are enlarged particularly in the vertical direction to permit the lateral movement of the upper leg members 29 and 30 as the knurled knob 38 is rotated.

Referring to FIGS. 1 and 2, the chip cracker device 10 has opposing and inwardly curved jaw portions 14 and 15 at the respective bottom portions 31 and 32 of the leg members 11 and 12. Importantly, the jaw portions 14 and 15 have opposing cutting edges 18 and 19 that are constructed and arranged to cut into and crack the hard chip bodies to expose the individual pins 27 and the connecting chip leads 28. The device 10 is shown in an operative position in FIG. 2 wherein it can be seen that a positive rotation of the knob structure 21 causes the upper leg portions 29 and 30 to be spread apart to thereby cause the lower jaw portions 14 and 15 to provide an aligned and opposing cutting plane on the lateral portions of the chip body 26.

Figure 7:
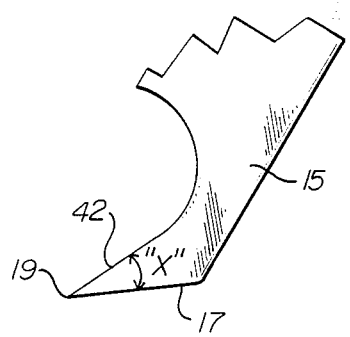
FIG. 7 is a partial plan view showing the angle of the cutting edge of the chip cracker device of the invention.

In operation, the opposing cutting edges 18 and 19 initially cut into the chip body 26 to split the body and to stabilize the device 10 onto the chip body 26. Further operation will cause the cutting edges 18 and 19 to further cut and split the chip body as well as to crush the chip 26 due to the angled configuration of cutting face 42 with respect to the bottom surface 17, as shown in FIG. 7.

As is further shown in FIG. 2, circuit boards 25 usually have a plurality of chips 26 mounted thereon. And, these chips 26 are typically aligned in a row whereby certain chip removal tools will not permit the engagement of an individual chip 26. Thus, the jaw portions 14 and 15 are angularly constructed and arranged to permit operation in relatively small work areas.

Figure 6:
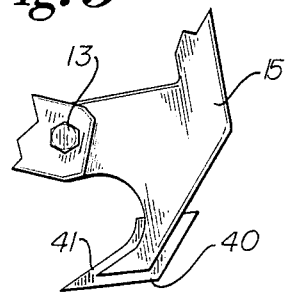
FIG. 6 is a partial plan view of an alternative cutting edge embodiment having the jaw adapter assembly of the invention.

Additionally, computer chips 26 are manufactured and utilized in a variety of sizes, for example, having body structures up to 1=3 inches. Consequently, it is desirable to provide chip cracking devices 10 having adjustable cutting edge dimensions. FIGS. 4 and 6 show such alternative device embodiments. FIG. 4 illustrates the chip cutting device having a lower curved jaw member 39 of a predetermined length to engage a large computer chip body. The jaw member structure 39 can be manufactured integral with the remaining leg member 12 structure or, as shown in FIG. 6, the elongated jaw structure can be comprised of a jaw adapter assembly 40 which fits over the existing lower jaw portion of the device 10. In this latter configuration, a plurality of jaw adapter assemblies, having varying lengths, can be provided to frictionally engage the curved jaw of the chip cracker device 10. Each adapter assembly 40 has a cutting edge 41 for engaging the lateral sides of the chip body to be removed. The cutting edge 41 of the adapter assembly 40 has a predetermined angle range the same as that of the cutting edges 18 and 19.

As previously discussed, the cutting edges 18 and 19 of the chip cracker device 10 are designed to apply a plane of cutting pressure on the opposing lateral sides of the chip body to be removed. It has been found that particular lower jaw structures and cutting edges of a predetermined angle range function best for this purpose. As shown in FIG. 7, the curved jaw 15 has a cutting edge 19 defined by the bottom surface 17 and the cutting surface 42. The angle defined by these surfaces 17 and 42 is shown as "x". Because of the hard silicon body structures of the chips 26, an angle range between 50 to 70 degrees has been found suitable, with a preferred angle being approximately 60 degrees.

Additionally, it has been found important that the bottom surfaces 16 and 17 of the jaws 14 and 15 be either flush or slightly angled. Thus, when the device 10 is in a closed position, either a flush or slightly angled V-shaped bottom portion is formed whereby the surfaces 16 and 17 are angled with respect to the horizontal of up to ten degrees. An angle of approximately six degrees, for example, has been found well suited for the functioning of this device.

The chip cracking device 10 is constructed of rigid materials so that the force exerted on the upper leg portions 29 and 30 is directly transferred to the cutting edges 18 and 19 of the lower jaws via the pivot member 13. Preferably, the cutting edges, lower jaw portions and adapter assemblies are constructed of a low carbon steel that is heat treated and oil quenched for hardening. However, any rigid device 10 structure having cutting edges of a composition capable of splitting or cracking computer chip bodies are within the purview of this invention.

As many changes are possible to the embodiments of this invention, utilizing the teachings thereof, the description above and the accompanying drawings should be viewed in the illustrative and not in the limited sense.

That which is claimed is:

1. A chip cracker device for aiding the removal of a computer chip of the type having a body with pins and leads from a circuit board, said chip cracker device comprising:
   (a) a pair of scissored leg members having opposing upper portions and bottom portions,
   (b) a pivot member connecting said leg members between said upper and bottom portions and being constructed and arranged such that said leg members rotate in aligned movement,
   (c) opposing beveled cutting edges at said leg member bottom portions, each having a smooth and flat bottom surface and an upper cutting surface each cutting surface having an angle range of 50 to 70 degrees with respect to said bottom surface, said opposing bottom surfaces further being sloped at a predetermined angle to form a V-shaped bottom portion structure when said device is in a closed position, and
   (d) hand operable and adjustable leg spreading means operative on the top portion of said leg members for forcing said sloped opposing beveled cutting edges towards each other to crack a board mounted computer chip body to expose the pins for subsequent removal.

2. The chip cracker device of claim 1, wherein said predetermined angle of said sloping bottom surfaces ranges up to approximately ten degrees with respect to the horizontal.

3. The chip cracker device of claim 1, wherein said leg members are generally C-shaped in configuration and have an inwardly extending structure protruding from the C-shaped leg body.

4. The chip cracker device of claim 3, wherein said pivot member is disposed in said inwardly extending structures of said C-shaped leg members.

5. The chip cracker device of claim 1, wherein one said leg member has a threaded aperture in the top portion of one said leg member in alignment with the top portion of said other leg member and wherein said adjustable leg spreading means is comprised of a threaded shaft having a knob portion on one end thereof for the adjustable movement through said threaded aperture and for abutment against said other leg member.

6. The chip cracker device of claim 1, wherein said leg members have aligned apertures in said top portions thereof and wherein rotatable and threaded members are disposed in said leg members in alignment with said apertures and wherein said adjustable spreading means is comprised of a threaded shaft member having a knob structure generally centrally located thereon and having said threads oppositely disposed outwardly from said knob on said threaded shaft for engagement with the rotatable and threaded members.

7. The chip cracker device of claim 1, wherein said leg member bottom portions are constructed and arranged to receive an adapter structure and wherein at least one adapter structure is provided for extending the cutting edge length.

8. The chip cracker device of claim 7, wherein said adapter structure has a sleeved body for frictionally engaging said beveled edged bottom portions of said leg members.

9. The chip cracker device of claim 1, wherein said cutting edges are comprised of hardened low carbon steel.

10. The chip cracker device of claim 1, wherein said adjustable leg spreading means includes a knurled knob for engaging the thumb of a user.

11. A computer chip cracking device for engaging the lateral surfaces of a mounted computer chip having a plurality of pins extending therefrom, said chip cracking device comprising:
   (a) a pair of generally curved leg members having upper and lower portions and each having an inwardly extending centrally disposed structure,
   (b) a pivot member connecting and being operative on said centrally disposed structures of said leg members,
   (c) opposing jaw members having smooth opposing bottom and upper cutting surfaces defining laterally disposed beveled cutting edges disposed at said lower portion of said leg members, said device further having at least one pair of sleeved body adapter structures each having a bottom surface and generally the same said beveled cutting edges, said bottom surfaces and said upper cutting surfaces as those of said jaw members and being constructed and arranged to frictionally engage said jaw members, said jaw member and adapter structure cutting surfaces each having a sloped angle range from 50 to 70 degrees with respect to their respective bottom surfaces, and (d) hand operable and adjustable force means operative on said upper portion of said leg members to force said beveled cutting edges toward each other to crack a mounted computer chip for removal.

12. The computer chip cracking device of claim 11, wherein one said leg member has a threaded aperture in its top portion and in alignment with the top portion of said other leg member and wherein said adjustable force means is comprised of a threaded shaft having a knob portion on one end thereof for the adjustable movement through said threaded aperture and for abutment against said other leg member.

13. The computer chip cracking device of claim 11, wherein said leg members have aligned apertures in said top portions thereof and wherein rotatable and threaded members are disposed in said leg members in alignment with said apertures and wherein said adjustable force means is comprised of a threaded shaft member having a knob structure generally centrally located thereon and having said threads oppositely disposed outwardly from said knob on said threaded shaft for engagement with the rotatable and threaded members.

14. The computer chip cracking device of claim 11, wherein said cutting edges are comprised of hardened low carbon steel.

15. The computer chip cracking device of claim 11, wherein said adjustable force means includes a knurled knob for engaging the thumb of a user.

* * * * *